United States Patent
Lin et al.

(10) Patent No.: US 9,330,987 B2
(45) Date of Patent: May 3, 2016

(54) HOT SPOT IDENTIFICATION, INSPECTION, AND REVIEW

(71) Applicant: Hermes-Microvision, Inc., Hsinchu (TW)

(72) Inventors: Steve Lin, San Jose, CA (US); Wei Fang, Milpitas, CA (US); Eric Ma, San Jose, CA (US); Zhonghua Dong, Sunnyvale, CA (US); Jon Chiang, Beaventon, OR (US); Yan Zhao, San Jose, CA (US); Chester Kuo, Taipei (TW); Zhongwei Chen, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 0 days.

(21) Appl. No.: 14/481,247

(22) Filed: Sep. 9, 2014

(65) Prior Publication Data

US 2015/0069232 A1   Mar. 12, 2015

Related U.S. Application Data

(60) Provisional application No. 61/875,390, filed on Sep. 9, 2013.

(51) Int. Cl.
| | |
|---|---|
| *H01J 37/26* | (2006.01) |
| *H01L 21/00* | (2006.01) |
| *G03F 7/00* | (2006.01) |
| *H01L 21/66* | (2006.01) |
| *G03F 7/20* | (2006.01) |
| *G03F 1/86* | (2012.01) |

(52) U.S. Cl.
CPC ............... *H01L 22/12* (2013.01); *G03F 1/86* (2013.01); *G03F 7/7065* (2013.01); *H01J 2237/103*; (2013.01); *H01J 2237/221* (2013.01); *H01J 2237/2817* (2013.01)

(58) Field of Classification Search
CPC ......... H01J 37/20; H01J 37/222; H01J 37/26; H01J 37/261; H01J 37/268; H01J 37/28; G03F 7/7065; G03F 7/70616; H01L 22/00; G06F 17/50
USPC ................. 250/306, 307, 310, 311; 382/149; 703/14
See application file for complete search history.

(56) References Cited

U.S. PATENT DOCUMENTS

| | | | | |
|---|---|---|---|---|
| 6,392,231 | B1 * | 5/2002 | Chen | H01J 37/141 250/310 |
| 2006/0289752 | A1 * | 12/2006 | Fukunishi et al. | 250/310 |
| 2007/0230770 | A1 * | 10/2007 | Kulkarni et al. | 382/149 |
| 2007/0288219 | A1 * | 12/2007 | Zafar | G03F 1/84 703/14 |
| 2009/0129664 | A1 * | 5/2009 | Tsuchiya et al. | 382/149 |
| 2012/0145894 | A1 * | 6/2012 | Wu et al. | 250/307 |
| 2012/0314054 | A1 * | 12/2012 | Chou | G05B 19/41875 348/87 |
| 2013/0064442 | A1 * | 3/2013 | Chang | G06T 7/001 382/149 |

* cited by examiner

*Primary Examiner* — Nicole Ippolito
*Assistant Examiner* — David E Smith
(74) *Attorney, Agent, or Firm* — WPAT, PC; Justin King

(57) ABSTRACT

A method for identifying, inspecting, and reviewing all hot spots on a specimen is disclosed by using at least one SORIL e-beam tool. A full die on a semiconductor wafer is scanned by using a first identification recipe to obtain a full die image of that die and then design layout data is aligned and compared with the full die image to identify hot spots on the full die. Threshold levels used to identify hot spots can be varied and depend on the background environments close thereto, materials of the specimens, defect types, and design layout data. A second recipe is used to selectively inspect locations of all hot spots to identify killers, and then killers can be reviewed with a third recipe.

25 Claims, 9 Drawing Sheets

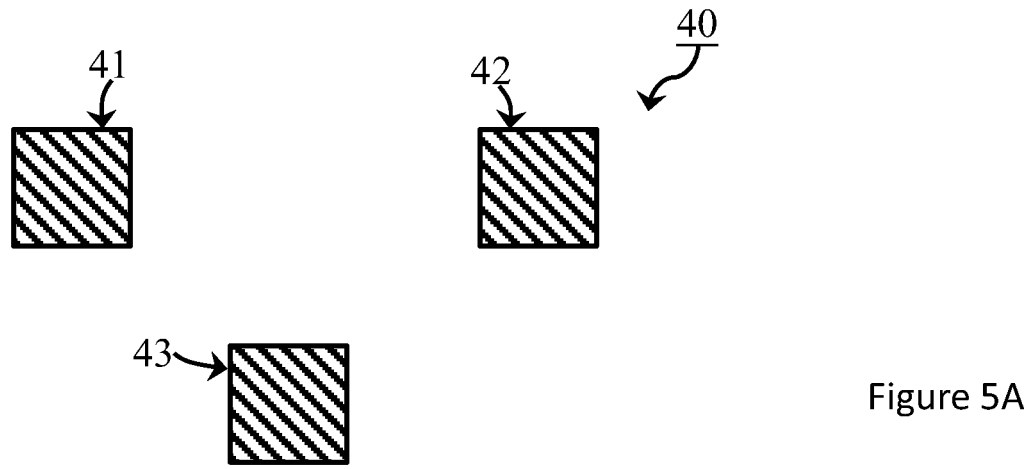
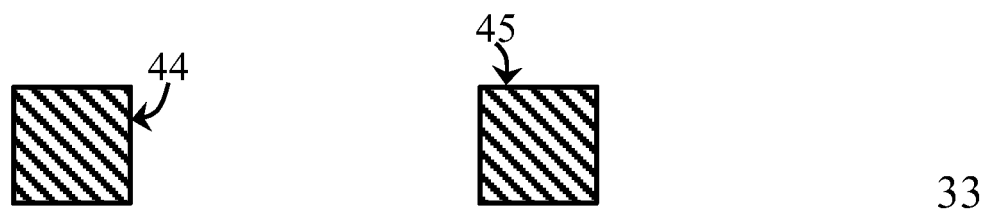
Figure 5A
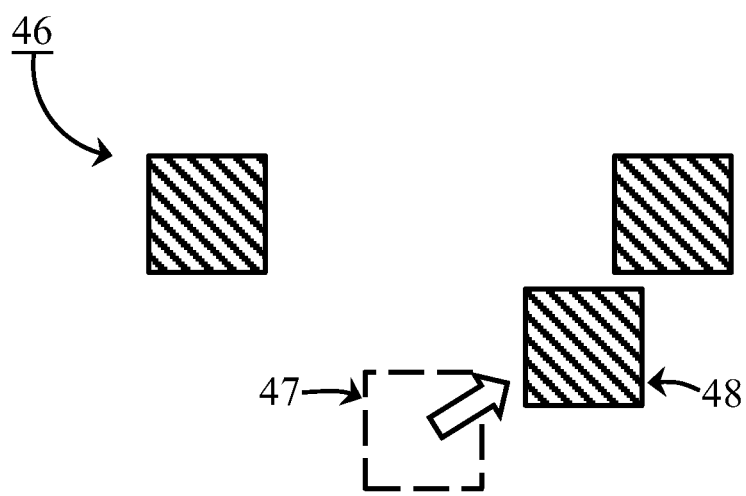
Figure 5B

HOT SPOT IDENTIFICATION, INSPECTION, AND REVIEW

CLAIM OF PRIORITY

This application claims the benefit of priority of U.S. provisional application No. 61/875,390 entitled to Lin et al filed Sep. 9, 2013 and entitled "Hot Spot Identification, Inspection, and Review", the entire disclosures of which are incorporated herein by reference.

BACKGROUND OF THE INVENTION

1. Field of the Invention

The present invention generally relates to a method and a system for hot spot identification, inspection, and review, and more particularly to a method and a SORIL e-beam tool that can provide high resolution scanning, and large scanning field of view to quickly identify, inspect, and review hot spots on a specimen for semiconductor manufacturing process.

2. Description of the Prior Art

The semiconductor fabrication includes combinations of thermal oxidation process, doping process, lithographic process, etching process, deposition process, chemical mechanical polishing processes, and other processes. The combination of these processes can form integrated circuits in a small chip, and applications of the semiconductor devices can be the computation, communication, storage, and other specific applications.

Every single step must be kept at a very high yield such that hundreds of steps involved in the semiconductor fabrication can be commercial profitable. For examples, if averaged yield among a hundred processes is 99%, and the end result to a product would only have 36.6% yield. However, if averaged yield is enhanced to 99.9%, the final product will have approximately 90.5% yield, which would enhance volume profit in commercial consideration. Hence, yield management is very crucial.

A killer, in the semiconductor manufacture process, is the defect which will result in the malfunction of a chip. That means there may be some defects that will not affect function of circuits. Hence, from the original design, killers are the crucial target to be eliminated in every semiconductor fabrication process.

However, for nowadays semiconductor fabrication process, such as the node has reached below 20 nm, killers are hard to be found. Thus, another strategy to maintain yield needs to be developed. A hot spot is a weak point which has higher possibility to incur killers during design or process fabrication. Thus, to monitor and identify all hot spots in semiconductor process will be a critical step to enhance yield rate.

One method for identifying hot spot is by using conjectures and experiences with original design layout data, such as GDS (Graphic Design System) information, to develop algorithms and failure bit map, but this method can't predict so well for the new developed mask and process. Moreover, such conjectures and experiences will highly depend on manufacturing process; even if there are different processes with the same mask, hot spots may always be variant. Further, also by using software and algorithm, this method is a very time consuming process, such as several month for a hot spot to be conjectured.

Another method is by using optical inspection tool, but resolution for an optical inspection tool is too large to inspect hot spots smaller than 20 nm, due to wavelength of the optical source is 193 nm. Even by using algorithm to conjecture unusual areas in an optical inspection, not only resolution of optical inspection tool can be hardly used for features less than 20 nm but also small defects in the scanned image are averaged out by using algorithm. Further, foundry now concerns defect of half pitch of the semiconductor node; that is features about 10 nm or below must be detected.

Therefore, a new method and system to identify and review hot spots for the next semiconductor node is necessary.

SUMMARY OF THE INVENTION

The present invention is directed to a method and a SORIL e-beam inspection system for hot spots identification, inspection, and review, which can quickly in-situ identify, inspect, and further review hot spots. It also provides a relatively high resolution to detect defects less than 5 nm on a specimen, a relative large scanning field of view (FOV), and a variant threshold level. Thus, it is a highly desirable schedule for semiconductor manufacturing process to a great degree to develop new circuit layout on mask or new developed process steps. Furthermore, total hot spots can be identified without conjecture or averaged by algorithm, and all hot spots in a die can be identified exactly within a practical schedule.

In one embodiment, a method for identifying hot spots in a die is disclosed, which comprises steps of completely scanning the die by using a SORIL charged particle beam tool to generate a full die image, and aligning and comparing the full die image to a design layout data corresponding to the die with variant threshold levels.

In the embodiment, the SORIL charged particle beam tool is an SORIL electron beam tool, and the design layout data is GDS. The variant threshold levels define abnormalities in the full die image, in which a threshold level can be a range of grey levels, and a location with a specific grey level more or less than the threshold level is identified abnormal. Moreover, the variant threshold levels means the ranges can be different at different locations, grey levels, or some other factors. The variant threshold levels define abnormalities in the full die image, in which a threshold level can be a pre-defined grey level. A location with a specific grey level more or less than the threshold level can be identified abnormal. The pre-defined grey level is different.

The present invention also provides a method for identifying and inspecting hot spots, which comprises steps of completely scanning a pre-determined die by using a SORIL e-beam tool to generate a full die image; aligning and comparing the full die image to a design layout data corresponding to the pre-determined die with variant threshold levels, such that locations of the hot spots can be identified; and selectively scanning the locations of all other dice than the pre-determined die by using the SORIL e-beam tool to inspect the hot spots.

The present invention further provides a method for identifying and inspecting hot spots, which comprises steps of completely scanning a die by using a SORIL e-beam tool with a first recipe to generate a full die image; aligning and comparing the full die image to a design layout data corresponding to the die with variant threshold levels, such that locations of the hot spots can be identified; and vector-scanning the locations by using the SORIL e-beam tool to inspect the hot spots with a second recipe. The second recipe includes all other dice than the die.

The present invention still provides a method for managing yield in a semiconductor process, which comprises steps of completely scanning a die by using a SORIL e-beam tool with a first recipe to generate a full die image; aligning and comparing the full die image to a design layout data corresponding to the die with variant threshold levels, such that locations of the hot spots can be identified; selectively scanning the locations by using the SORIL e-beam tool with a second recipe to inspect the hot spots, such that selective hot spots can be identified as killers; and reviewing the killers by using an e-beam tool with a third recipe to analyze and generate detail information of the killers.

The step of reviewing can include tilt scanning the killers. The second recipe includes all other dice than the die. The second recipe includes a larger beam spot than the third recipe thereof. The third recipe includes a beam spot size less than 2 nm. The e-beam inspection tool is the SORIL e-beam tool.

The present invention still further provides a system for managing yield in a semiconductor process, which comprises an electron source for generating a primary electron beam, a condenser lens for condensing the primary electron beam, a SORIL system for focusing the primary electron beam on the die to collect the secondary electrons or back-scattered electrons generated by the primary electron beam colliding with the die, and a detector for receiving the secondary electron beam or back-scattered electrons from the die. The system conducts steps of completely scanning a full die by using the system with a first recipe to generate a full die image corresponding to the full die; aligning and comparing the full die image to a design layout data corresponding to the full die to identify hot spots, wherein threshold levels used to determine the hot spots are variant, such that locations of the hot spots can be identified; and selectively scanning the locations by using the system with a second recipe to inspect the hot spots.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 5A and FIG. 5B are schematic views showing a square fixed pattern structure of a GDS image and a OPC image with a shift as a hot spot in gray layer contrast E-beam inspection in accordance with an embodiment of the present invention;

DETAILED DESCRIPTION OF EXAMPLE EMBODIMENTS

Figure 1:
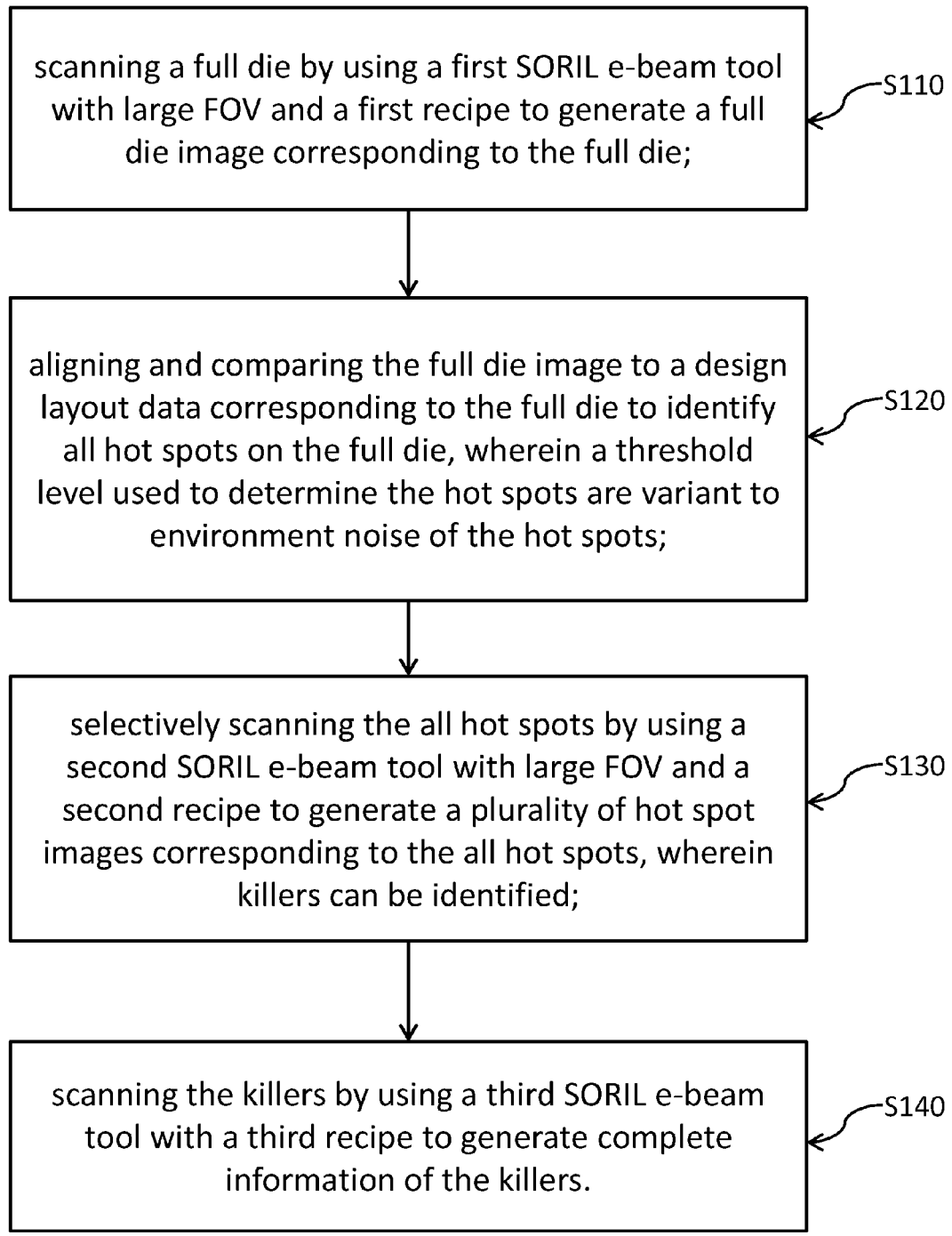
FIG. 1 is a flowchart schematically illustrating steps of a hot spot identification, inspection, and review according to an embodiment of the present invention.

Various example embodiments of the present invention will now be described herein more fully with reference to the accompanying drawings in which some example embodiments of the invention are shown. The drawings are merely illustrative, and in no way limit the claims to what is illustrated. Without limiting the scope of the protection of the present invention, all the description and drawings of the embodiments are not be used o limit the present invention to specific charged particles.

In the drawings, relative dimensions of each component and among every component may be exaggerated for clarity. Within the following description of the drawings, the same or like reference numbers refer to the same or like components or entities throughout the description of the figures, and only the differences with respect to the individual embodiments are described.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

Killers are so crucial to the semiconductor process and must be identified in RD (Research and Development) stage or pilot run. And hot spots must be monitored in mass production. Because the semiconductor node has been reduced to less than 20 nm and half-pitch defects are considered significant, high resolution inspection will be crucial to the node less than 20 nm.

The ebeam (electron beam) tool would be a good candidate for finding hot spots. For example, minimum killers of half-pitch defect would be 5 nm at 10 nm node generation. In order to catch killers of 5 nm, pixel size of ebeam tools should be 3 nm or 2.5 nm, which will be far less than the 50 nm optical beam spot size.

Please refer to FIG. 1, a scanning step S110 is provided first, wherein a first SORIL (Swing Objective Retard Immersion Lens) inspection system with 3 nm to 10 nm spot size and large FOV (Field of View) is used to scan a full die with a first recipe in this invention. The SORIL inspection system can be a charged particle, such as electron, beam tool for scanning sample wafer. A full die image, corresponding to the full die, is then obtained. The first recipe may include a pre-determined die, landing energy, beam current, and some other parameters adjustable by the SORIL inspection system. In this step, a relative large beam current is necessary for throughput consideration.

Then, in a step S120, the full die image is then aligned and compared to design layout data with variant threshold levels to identify hot spots. The design layout data, corresponding to the full die, can be GDS (Graphic Design System) or OASIS (Open Artwork System Interchange Standard) format. Variant threshold levels can depend on locations, patterns or environment noise levels. Thus, a method for identifying hot spots is provided.

Figure 2:
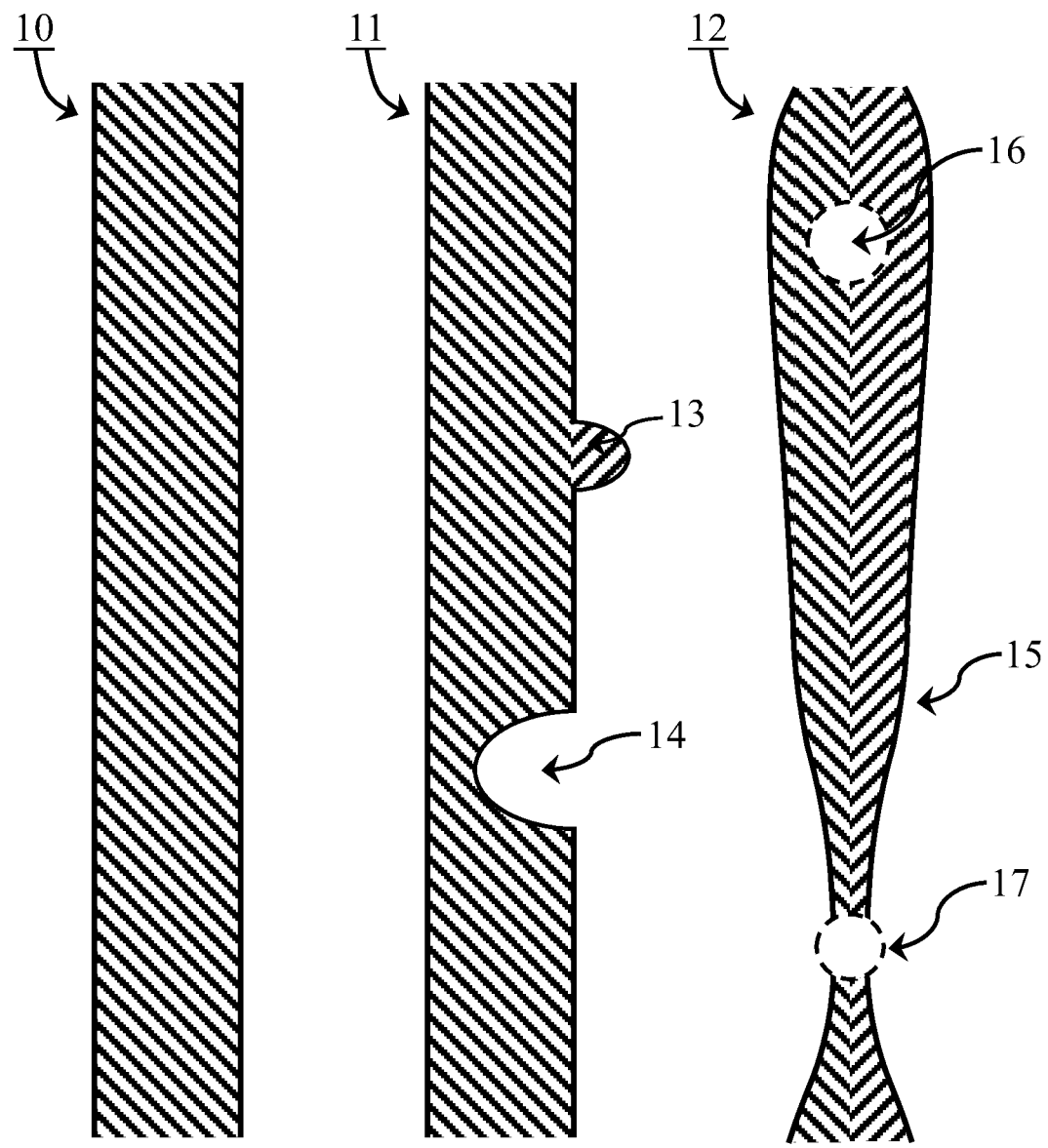
FIG. 2 is a schematic view showing a straight line pattern of GDS image and OPC images with hot spots and killers in gray level contrast of e-beam inspection in accordance with an embodiment of the present invention.

Hot spots are regions on the sample wafer that different from patterns in the original design layout data. Please refer to FIG. 2, a line pattern 10 is designed in the original design layout data and is transferred to the semiconductor wafer by using deposition, lithographic, and etching processes. However, if there are other patterns very close to the line pattern 10, or if incorrect OPC (Optical Proximity Correction) is applied, some abnormalities 13 and 14 may appear in the line pattern 11 on the semiconductor wafer. If the abnormalities 13 and 14 are usually appeared systematically and weak, then they are hot spots. Some hot spots may not affect the operation of the integrated circuits, such as hot spots 15 and 16 in line pattern 12. However, for the hot spot 17 in the line pattern 12, it becomes a killer for the line pattern 12 is open.

Figure 3:
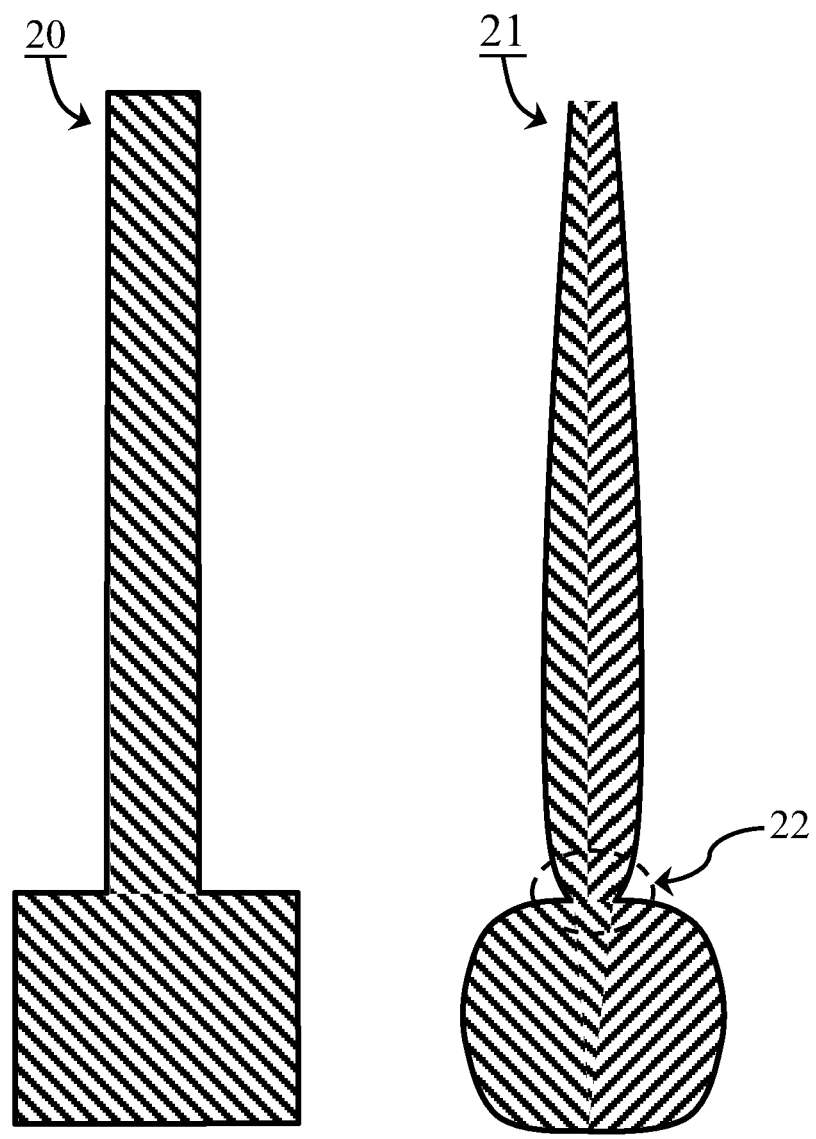
FIG. 3 is a schematic view showing a straight line pattern with pad of GDS image and an OPC image with probable incurring hot spot between connection in gray lever contrast e-beam inspection in accordance with an embodiment of the present invention.
Figure 4A:
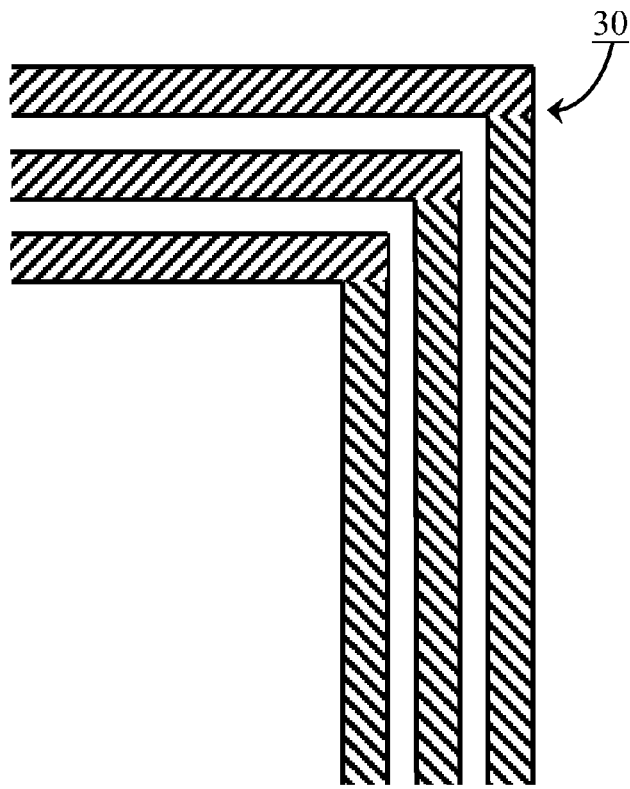
FIG. 4A and FIG. 4B are schematic views showing a $_1$-like shape and repeated pattern structure of GDS image and an OPC image with probable incurring hot spots at the corner in gray layer contrast e-beam inspection in accordance with an embodiment of the present invention.
Figure 4B:
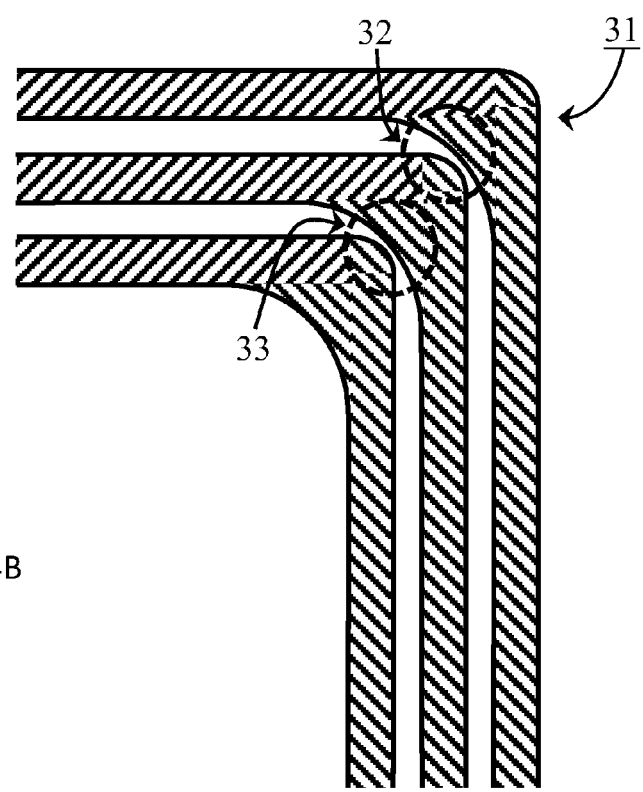

Different patterns will incur different kind of hot spots. For example, in FIG. 3, a pattern 20 with a pad below in the GDS or OASIS may be distorted as pattern 21 with a hot spot 22. This hot spot 22 would incur open circuit very often. In FIG. 4A, a pattern 30 with three corners in the original design layout data, after patterned to a wafer, may incur hot spots 32 and 33 of pattern 31 in FIG. 4B. Such a hot spot in FIG. 4B always come from the exposure step in the lithographic process, because inner portion of the corner is always under-exposure and outer portion of the corner is always over-exposure due to the diffraction. OPC would be hardly applied to this kind of patterns to reduce hot spots.

The original design layout data is important for the hot spot identification, compared to traditional random mode or array mode methods. The random mode, especially for patterns with logic circuits, needs to scan at least two dice to obtain at least two images of the two dice, and the two images are then compared with each other. If the two images are the same or similar with each other, there will be no abnormality. If the two images are different, a third image must be included to identify abnormality. For some particular semiconductor applications, such as memory chip, patterns are always duplicated and only one image of one die can be used to identify hot spot. However, for some kind of hot spots, such as shown in FIGS. 5A and 5B, the hot spot 47 can't be identified without the information of the original design layout data if only random mode or array mode is applied. In FIG. 5A, there are five patterns 41, 42, 43, 44, and 44 forming a group 40, and the OPC is applied to this group 40. However, if the OPC makes the pattern 43 from location 47 to location 48, it's a systematic error and hot spot 48 can't be identified without original design layout data, because every error is duplicated. Such a compare with original design layout data is an absolute way to find abnormality in a scanned image. For some defects which are systematically incurred by, for example, shift defects caused by OPC design, which will always appear at exact position, and the process uniformity is too well to find such shift defects if there is no GDS information involved.

Figure 6A:
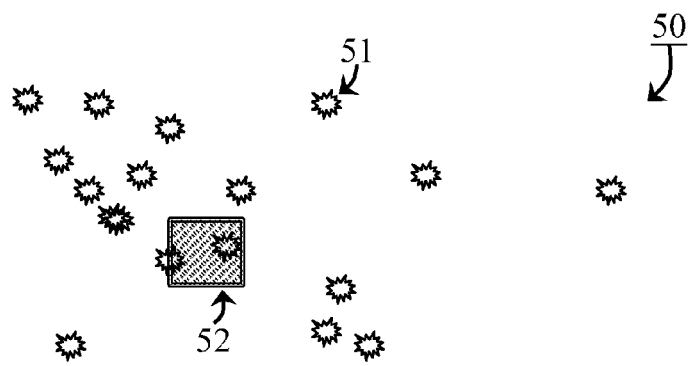
FIG. 6A and FIG. 6B are schematic views showing a small FOV to find hot spots on a die for a conventional review SEM and a SORIL e-beam tool with enough large FOV to scan and identify all hot spots in accordance with an embodiment of the present invention.
Figure 6A:
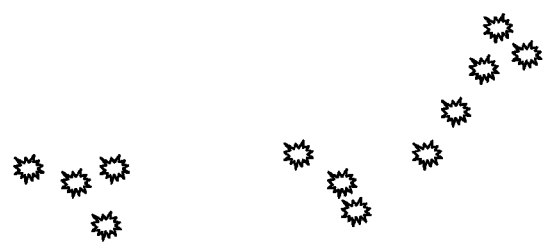
Figure 6B:
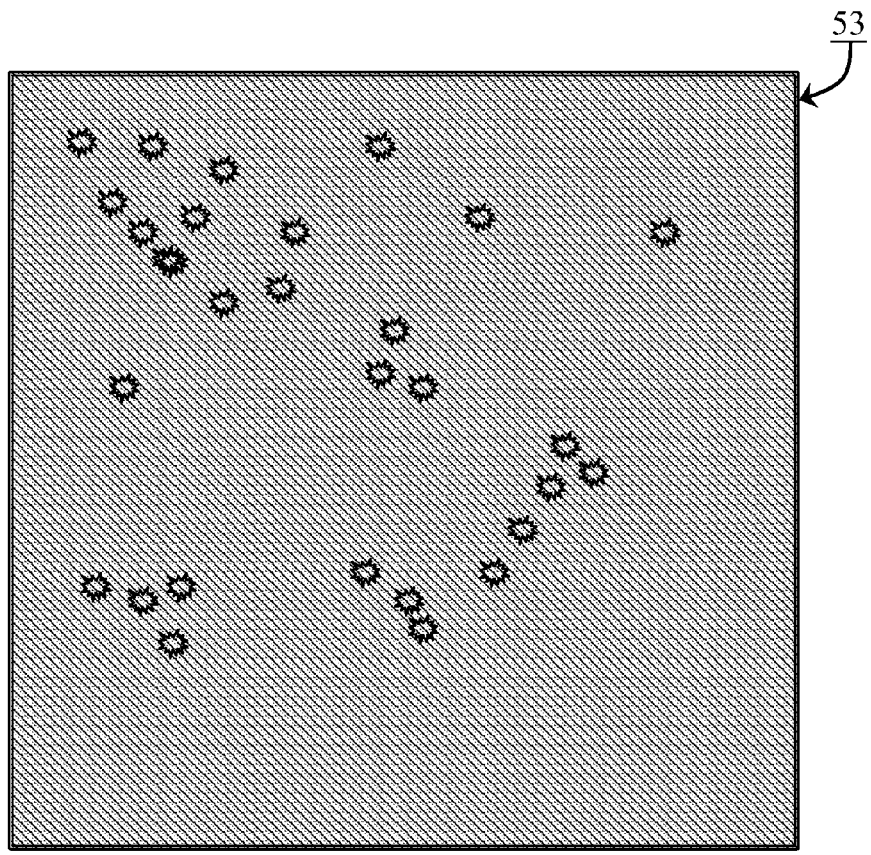

The large FOV is also important in this invention, because scan duration is very crucial to the semiconductor manufacturer. For conventional ebeam tool, such as review SEM (Scanning Electron Microscopy) or CD (critical dimension) SEM, the FOV is relative small, such as region 52 in FIG. 6A. In FIG. 6A, if there are a plurality of hot spots 51 to be scanned in the region 50 with region 52 as FOV, several stage movements and corresponding scanning steps must be done to cover the region 50. Thus, in order to scan a full die, several months must be incurred. However, if a large FOV 53, such as in FIG. 6B, can be applied, there is no necessary to move stage and a lot of stage moving-time can be saved. If the FOV is large enough, only two weeks may be necessary to scan a full die. A SORIL ebeam tool can provide enough large FOV for present invention.

For example, for commercial review SEM (Scanning Electron Microscope), FOV is 6 µm×6 µm. Further, for a die size of 10 mm×10 mm application, if one image is taken by 1.5 minute and the review SEM will spend about 100 months to scan the whole die. Therefore, an ebeam tool with enough large FOV to scan the whole die to identify hot spots in practical manufacture is important, because the most time consumed in taking one FOV image includes the stage movement, and several FOV images alignment also incur time consumption.

A SORIL ebeam tool, proposed by Chen et al., can provide enough large FOV with, for example, about hundred times larger FOV compared to the review SEM, with 3 nm beam spot size of first recipe to firstly scan the whole die within two weeks. Thus, whole die inspection to identify hot spots would be a practical way. Thus, time consuming of stage moves and overhead of FOV images overlaps can be reduced greatly.

Conventional threshold level is a fixed number to find abnormality. Variant threshold levels for identify hot spots are applied to the present invention. Please refer to FIG. 7, different locations with different materials will reflect different grey levels under ebeam inspection. The threshold levels 60 in the left may be larger than the threshold levels 62 in the right, because the larger grey levels the more possible the environment noise is. Thus, the peak 61 in the left is identified abnormal, and neighbor peaks near to the peak 61, although may be significant compared to the peaks near peaks 63 and 64, can be normal because of larger noise. The peaks 63 and 64 are identified abnormal by the threshold levels 62.

Figure 7:
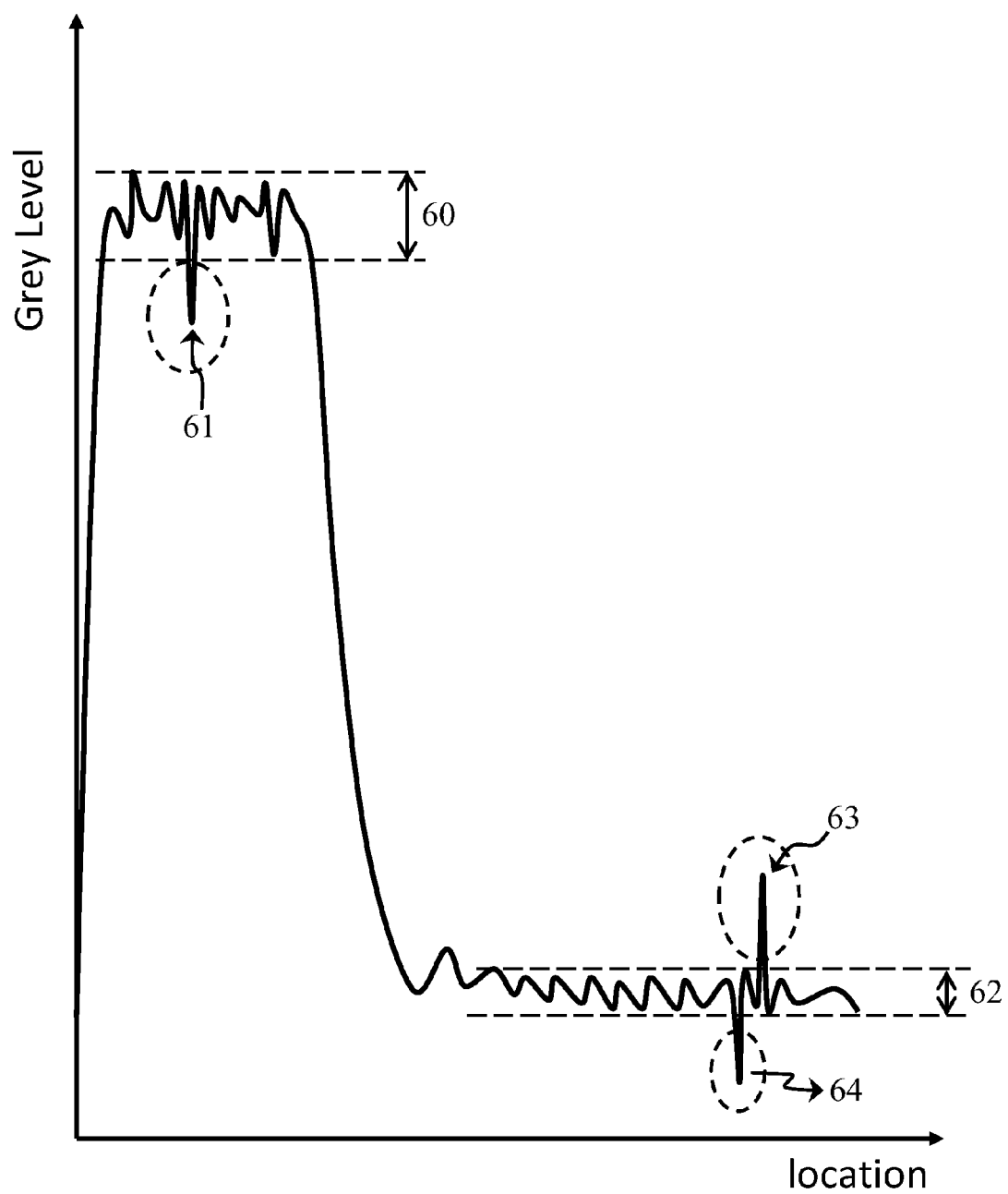
FIG. 7 is a curve diagram schematically illustrating a variant threshold gray levels to identify hot spots depending upon concerned location in accordance with an embodiment of the present invention.

In FIG. 7, the threshold levels 60 and 62 are ranges. For one situation, threshold level can be a single value and the abnormality can be identified if grey level of a location is higher than the threshold level for bright abnormal. For another situation, threshold level can be a single value and the abnormality can be identified if grey level of a location is lower than the threshold level for dark abnormal. In this embodiment, a variant threshold level, dependent upon concerned location, is determined to the environment noise of the location. For example, the location with high grey level has larger noises and may have larger range of threshold. On the other hand, the location with low grey level has fewer noises and may have smaller range of threshold. Further, different material will cause variant noise. Threshold level can be also determined by different defect types, and GDS information. One important advantage is that the SORIL ebeam tool can find protrusion defect 13 in FIG. 2, because the small beam size can catch this defect.

After the hot spots are identified, all other dice on the wafer can be inspected by using information of the identified hot spots; that means there is no necessary to scan a full die but locations of the hot spots are enough. Next, back to FIG. 1 in a step of S130, a second SORIL ebeam tool, with a second recipe, will vector scan, or selectively inspect the identified hot spots within a large FOV which could improve throughput and reduce charging effect. The second SORIL ebeam tool can be the first SORIL ebeam tool, and the second recipe may be same to the first recipe except all other dice than the pre-determined, scanned die. Thus, a method for inspecting hot spots is provided.

Figure 8:
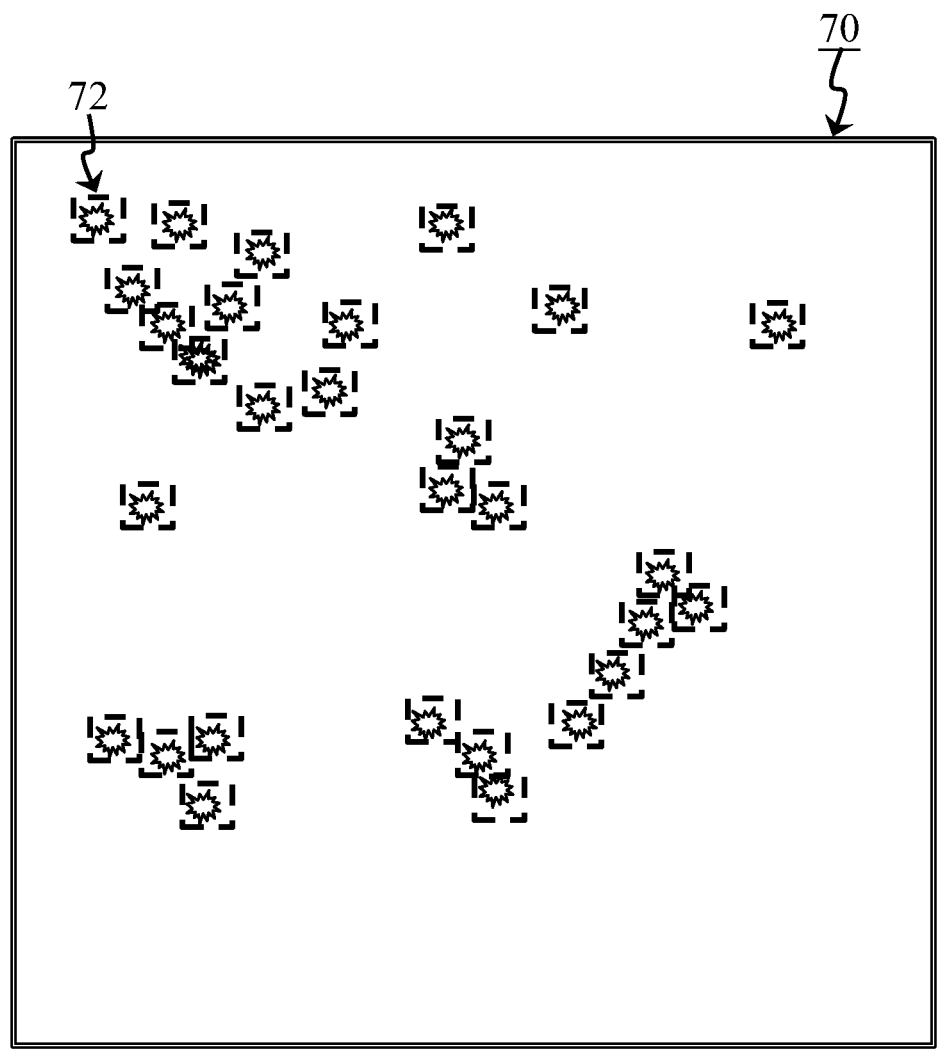
FIG. 8 is a schematic view showing selectively scanning regions of all hot spots in accordance with an embodiment of the present invention.

Please refer to FIG. 8, for a FOV 70, if a plurality of regions 72 is identified hot spots and has to be inspected, there is no necessary to scan all FOV 70, but the plurality of individual regions 72 are necessary to be scanned selectively. This is the vector scan compared the full scan.

In the vector scan step, if killers or interesting hot spots are identified, a review step should be processed to find out root cause of the killers or how weak of the hot spots. Back to FIG. 1 in a step of 5140, killers are reviewed by using a third SORIL ebeam tool with a third recipe to generate complete information of the killers. An energy filter can be provided to the third SORIL ebeam tool to collect secondary electrons. Further, tilt primary beam can also be provided to scan sample wafer. The third SORIL ebeam tool can be the first SORIL ebeam tool, such that the vector step and review step can be processed in situ. In the third recipe, a smaller beam spot size, such as 2 nm, than that of the second recipe is used to clearly scan the killer such that detail image of the killers can be illustrated. Thus, a method for reviewing killers or hot spot is provided. The tool used in the third scan step can be also a review SEM.

Figure 9:
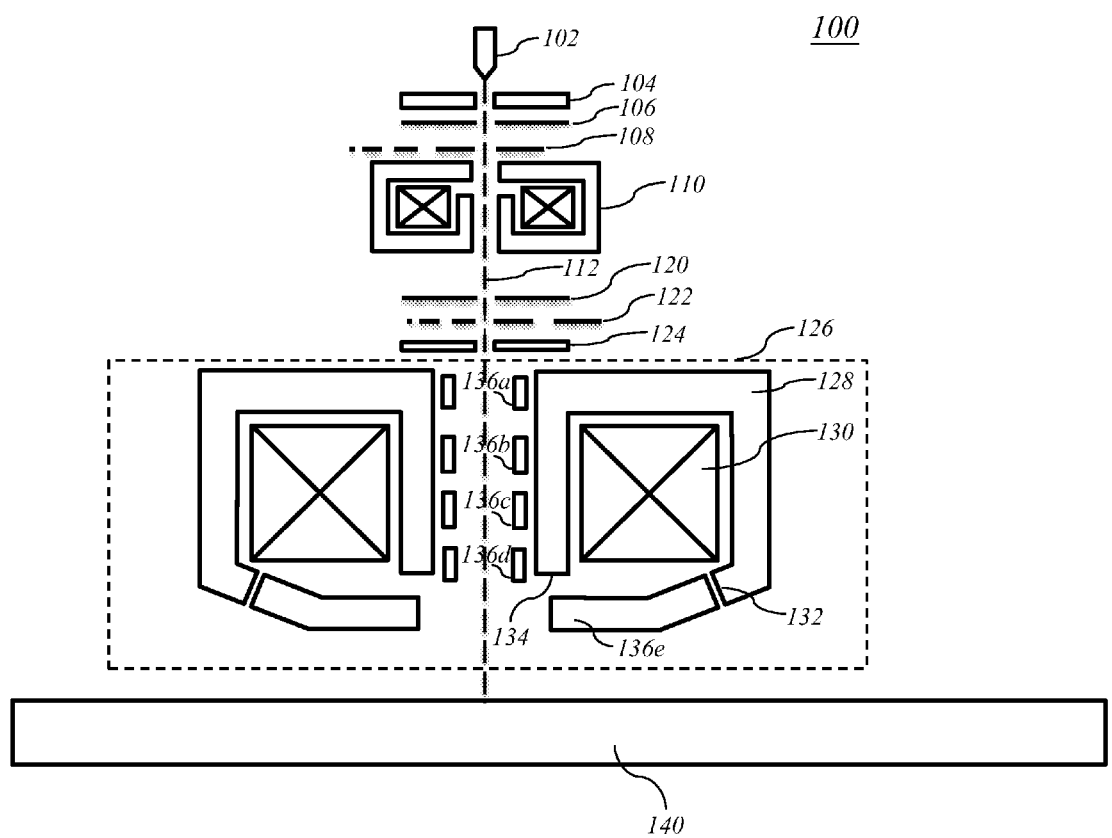
FIG. 9 is a schematic diagrammatic representation of a SORIL e-beam system.

Please refer to FIG. 9, an ebeam tool 100 is provided that has a swinging objective retarding immersion lens (SORIL) inspection system with an advanced electron optics focusing, deflection and signal capture ability in accordance with the present invention. In this embodiment, the scanning electron microscope 100 comprises a particle beam source 102, an anode electrode 104, a first beam-defining aperture 106 which confines the beam diameter to a range of about 20 µm to 200 µm, a first selective aperture 108 which determines the size of the beam allowed to enter the condenser lens, a condenser lens 110 which gather and shrink substantially particle beam so that can get high intensity, low spreading and small spot size beam, a secondary beam-defining aperture 120, a secondary selective aperture 122 which is used to reduce a spherical aberration, an annular detector unit 124 which collects secondary electrons (SE) and back scattered electrons (BSE) emitted from the specimen during the scanning operation, an objective lens system 126 including a magnetic lens therein for generating a magnetic field in the vicinity of the specimen to focus the particles of the particle beam on the specimen, and a deflection system including a plurality of deflection units 136a-136e for deflecting the particle beam to allow scanning on the specimen with large area and minimize the introduction of aberrations into the beam when deflecting the primary e-beam. For reference purposes, a beam axis 112 is defined as the line connecting the particle beam source 102 to the specimen 140 and is designated the Z-axis, the X and Y axes defining a plane transverse to the Z-axis.

The magnetic lens includes magnetic material 128 and exciting coils 130 for providing magnetomotive force to a magnetic circuit having field lines through the magnetic material and between the pole faces 132 and 134. The enter bore of the magnetic lens has the shape of a circular bucket which is axially symmetric about the Z-axis. At the place where the primary particle beams enter the lens system. A lens aperture at the point where the primary particle beam exits the magnetic lens is circumscribed by the pole face 134.

Residing in the center bore is deflection units 136a-136d. These units are disk-shaped rings which are axially symmetric about the Z-axis. Located outside of the central bore is deflection unit 136e which is coaxial with the Z-axis and similar in construction to the deflection units within the central bore.

Objective lens 126 focuses the particle beam into a small spot size which is scanned over the specimen 140. Typically, the specimen is a semiconductor wafer having feature sizes of about 0.05 µm to 0.2 µm or larger.

Magnetic material 128 and exciting coils 130 of the objective lens form a type of magnetic lens called a side-pole lens. The side-pole magnetic lens is preferred because it has improved capability in reducing the chromatic and spherical aberration typically associated with other types of objective lens and is better at extending its field below the lens aperture and through the specimen 140. In the side-pole magnetic lens, magnetic material 128 is shaped to form circular pole face 132 and ring-shaped pole face 134 between which the magnetic field lines connect pole face 132 and 134 to complete the magnetic circuit. This produces a magnetic field which is designed to extend through the deflection unit 136e and specimen 140 in its path to pole face 132. Accordingly, specimen 140 is immersed in the magnetic field of lens. Magnetic material 128 is preferably iron, iron alloy or other high permeability material for providing a low reluctance path for the magnetic field generated by the exciting coils 130. The goal of magnetic lens 128 is to generate a magnetic field with a large component perpendicular to the Z-axis for converging lens action above the specimen and to have the magnetic field substantially parallel to the Z-axis at the specimen. Magnetic material 128 is shaped to form a bucket-shaped central bore which is axially symmetric about the Z-axis and which provides a place for locating the deflection units 136a-136d within the magnetic lens. Each deflection unit can be the same diameter or have a different diameter and fits at a particular position along the Z-axis within the bucket-shaped space. If each deflection unit has a different diameter, for the deflection units within the magnetic lens, deflection unit 136a is the largest in diameter and deflection unit 136d is the smallest in diameter. Deflection unit 136e is located below the exciting coils 130 and within the influence of the magnetic field from the magnetic lens. Deflection units 136a-136e work together to deflect the particle beam so that the specimen 140 can be scanned.

In accordance with the present invention, a first set or "swinging group" of deflection units 136a, 136d and 136e is dedicated to the accurately but relatively slowly positioning of the focused beam over a precise point on a specimen within the deflection field of the lens. The swinging group of deflection units can deflect the beam spot a deflection field distance about 600 µm in one version of the invention. A second set of deflection units 136b and 136c is dedicated to producing a more rapid scanning movement of the beam to cover an area approximately 50 µm×50 µm, and the area on the position is determined by the first set of deflection units. Scanning is performed by dwelling on a point for a period of time (on the order of tens of nanoseconds), moving to the next point in a row of points and then repeating the scan operation for the next row until an entire grid of points covering the area is scanned.

Deflection unit 136e is particularly important to improve the size of the deflection field over the specimen because it is closest to the specimen and in the retarding field produced by the specimen. Thus deflection unit 136e will have a large effect on the position of the particle beam because it is deflecting a beam with much lower energy than the deflection unit 136a-136d and it is the deflection unit nearest the landing point of the beam on the specimen.

Below deflection unit 136e is the specimen 140, which is carefully positioned underneath the deflection unit 136e and to be within the focusing distance of the lens. The magnetic lens is focused to produce a small spot on the specimen by varying the current in the exciting coils 130. An increase in current creates a more intense field in the aperture, which causes the beam to converge to a spot at a position closer to pole piece 134. Decreasing the current causes the beam to converge to a spot at a distance father from pole piece 134. Not only is specimen 140 immersed within the magnetic field of the magnetic lens but it is also charged to have a potential for providing a retarding field to the particle beam near the specimen to reduce the energy of the particle beam when the beam collides with the specimen.

An advantage of such a method and a system is that it provides relatively high resolution to detect defects less than 5 nm on a specimen, a relatively large scanning field of view (FOV), and a variant threshold levels. It is beneficial for semiconductor manufacturer to develop new circuit layout on mask or new developed process steps and provides a tolerable schedule for semiconductor manufacturing process.

Another advantage of such a method and a system is that total hot spots can be identified without conjecture or averaged by algorithm and is a time-saving process. Furthermore, all hot spots in a die can be identified exactly so that selectively scan regions of all hot spots and review killers can be practiced within a practical schedule.

Although the present invention has been explained in relation to its preferred embodiment, it is to be understood that other modifications and variation can be made without departing the spirit and scope of the invention as hereafter claimed.

What is claimed is:

1. A method for identifying hot spots in a die, comprising:
   completely scanning the die by using a SORIL charged particle beam tool to generate a full die image at a resolution of 20 nm or less; and
   aligning and comparing the full die image to a design layout data corresponding to the die with variant threshold levels.

2. The method according to claim 1, wherein the SORIL charged particle beam tool is an SORIL electron beam tool.

3. The method according to claim 2, wherein the design layout data is GDS(Graphic Design System).

4. The method according to claim 3, wherein the variant threshold levels define abnormalities in the full die image, in which a threshold level is a range of grey levels, and a location with a specific grey level more or less than the threshold level is identified abnormal.

5. The method according to claim 4, wherein the ranges of grey levels of the variant threshold levels are different.

6. The method according to claim 3, wherein the variant threshold levels define abnormalities in the full die image, in which a threshold level is a pre-defined grey level.

7. The method according to claim 6, wherein a location with a specific grey level more than the threshold level is identified abnormal.

8. The method according to claim 6, wherein a location with a specific grey level less than the threshold level is identified abnormal.

9. The method according to claim 6, wherein the pre-defined grey levels of the variant threshold levels are different.

10. A method for identifying and inspecting hot spots, comprising:
    completely scanning a pre-determined die by using a SORIL e-beam tool to generate a full die image at a resolution of 20 nm or less;
    aligning and comparing the full die image to a design layout data corresponding to the pre-determined die with variant threshold levels, such that locations of the hot spots can be identified; and
    selectively scanning the locations of all other dice than the pre-determined die by using the SORIL e-beam tool to inspect the hot spots.

11. The method according to claim 10, wherein the design layout data is GDS(Graphic Design System).

12. The method according to claim 11, wherein the variant threshold levels define abnormalities in the full die image, in which a threshold level is a range of grey levels, and a specific location with a specific grey level more or less than the threshold level is identified abnormal.

13. The method according to claim 12, wherein the ranges of grey levels of the variant threshold levels are different.

14. A method for identifying and inspecting hot spots, comprising:
    completely scanning a die by using a SORIL e-beam tool with a first recipe to generate a full die image at a resolution of 20 nm or less;
    aligning and comparing the full die image to a design layout data corresponding to the die with variant threshold levels, such that locations of the hot spots can be identified; and
    vector-scanning the locations by using the SORIL e-beam tool to inspect the hot spots with a second recipe.

15. The method according to claim 14, wherein the second recipe includes all other dice than the die.

16. A method for managing yield in a semiconductor process, comprising:
    completely scanning a die by using a SORIL e-beam tool with a first recipe to generate a full die image at a resolution of 20 nm or less;
    aligning and comparing the full die image to a design layout data corresponding to the die with variant threshold levels, such that locations of the hot spots can be identified;
    selectively scanning the locations by using the SORIL e-beam tool with a second recipe to inspect the hot spots, such that selective hot spots can be identified as killers; and
    reviewing the killers by using an e-beam tool with a third recipe to analyze and generate detail information of the killers.

17. The method according to claim 16, wherein the design layout data is GDS(Graphic Design System).

18. The method according to claim 17, wherein the variant threshold levels define abnormalities in the full die image, in which a threshold level is a range of grey levels, and a specific location with a specific grey level more or less than the threshold level is identified abnormal.

19. The method according to claim 18, wherein the ranges of grey levels of the variant threshold levels are different.

20. The method according to claim 19, wherein said step of reviewing includes tilt scanning the killers.

21. The method according to claim 19, wherein the second recipe includes all other dice than the die.

22. The method according to claim 21, wherein the second recipe includes a larger beam spot than the third recipe thereof.

23. The method according to claim 16, wherein the third recipe includes a beam spot size less than 2 nm.

24. The method according to claim 16, wherein the e-beam inspection tool is the SORIL e-beam tool.

25. A system for managing yield in a semiconductor process, comprising:
- an electron source for generating a primary electron beam;
- a condenser lens for condensing the primary electron beam;
- a SORIL system for focusing the primary electron beam on the die to collect the secondary electrons or back-scattered electrons generated by the primary electron beam colliding with the die; and
- a detector for receiving the secondary electron beam or back-scattered electrons from the die;
- wherein said system conducting steps of:
  - completely scanning a full die by using the system with a first recipe to generate a full die image corresponding to the full die at a resolution of 20 nm or less;
  - aligning and comparing the full die image to a design layout data corresponding to the full die to identify hot spots, wherein threshold levels used to determine the hot spots are variant, such that locations of the hot spots can be identified; and
  - selectively scanning the locations by using the system with a second recipe to inspect the hot spots.

* * * * *